(12) United States Patent
Sato

(10) Patent No.: US 7,704,036 B2
(45) Date of Patent: Apr. 27, 2010

(54) DRIVE SOURCE AND TRANSPORTATION ROBOT

(75) Inventor: Masaaki Sato, Fukuyama (JP)

(73) Assignee: Rorze Corporation, Fukuyama-Shi (JP)

( * ) Notice: Subject to any disclaimer, the term of this patent is extended or adjusted under 35 U.S.C. 154(b) by 355 days.

(21) Appl. No.: 11/631,679

(22) PCT Filed: Jul. 11, 2005

(86) PCT No.: PCT/JP2005/012746
§ 371 (c)(1),
(2), (4) Date: Jan. 5, 2007

(87) PCT Pub. No.: WO2006/006554

PCT Pub. Date: Jan. 19, 2006

(65) Prior Publication Data
US 2008/0019816 A1 Jan. 24, 2008

(30) Foreign Application Priority Data
Jul. 9, 2004 (JP) .............................. 2004-203997

(51) Int. Cl.
*B25J 17/00* (2006.01)
(52) U.S. Cl. .............. 414/744.5; 74/490.01; 74/490.03; 74/490.05; 901/23; 901/28
(58) Field of Classification Search .............. 414/744.5; 901/23, 28, 29; 74/490.01, 490.03, 490.05, 74/490.06
See application file for complete search history.

(56) References Cited

U.S. PATENT DOCUMENTS 5,314,293 A * 5/1994 Carlisle et al. ........... 414/744.5

(Continued)

FOREIGN PATENT DOCUMENTS

JP 4-206543 7/1992

(Continued)

OTHER PUBLICATIONS

Office Action issued for the relevant Korean patent application No. 2007-7000094 on May 28, 2008.

(Continued)

*Primary Examiner*—Donald Underwood
(74) *Attorney, Agent, or Firm*—Kratz, Quintos & Hanson, LLP

(57) ABSTRACT

The invention includes a base member attached to a casing. The inside of the casing can be a vacuum atmosphere. A partition wall is provided on the base member, the base member separating an air atmosphere and the vacuum atmosphere. A rotating member (a rotating portion of a driving source) is provided on the base member at a position different from the rotating member. An armature, which is a dust source, is provided on the air atmosphere side of the partition wall, thereby maintaining high cleanliness on the vacuum atmosphere side. Providing the partition wall and the rotating member at different positions eliminates the necessity of consideration on the rigidity of the partition wall for supporting the rotating member, thereby reducing the thickness of the partition wall. In addition, it is possible to reduce affection by deflection generated by the inertia or vibration caused by rotation of the rotating member, so that a distance between the armature and a magnet in the rotating member can be narrower than the related art. Accordingly, high accuracy in stopping positions can be realized.

16 Claims, 10 Drawing Sheets

U.S. PATENT DOCUMENTS 6,276,892 B1 * 8/2001 Haraguchi et al. ....... 414/744.5
6,363,808 B1 * 4/2002 Wakabayashi et al. ... 74/490.03

FOREIGN PATENT DOCUMENTS

| | | |
|---|---|---|
| JP | 8-506771 | 7/1996 |
| JP | 10-128692 | 5/1998 |
| JP | 2000-167792 | 6/2000 |
| JP | 2002-59386 | 2/2002 |
| KR | 2001-0061977 | 7/2001 |

OTHER PUBLICATIONS

Japanese Office Action dated Nov. 10, 2009 with English Translation.

* cited by examiner

DRIVE SOURCE AND TRANSPORTATION ROBOT

TECHNICAL FIELD

The present invention relates to a driving source and a transfer robot which are used in a vacuum atmosphere. Specifically, the invention relates to a driving source and a transfer robot provided with the driving source which require a highly clean environment when performing a transfer and a process and are disposed on a boundary between such an environment and the air, the transfer robot being for transferring a substrate or the like.

The invention may be applied to any article that requires a highly clean environment when performing a transfer and a process. The description below will take a semiconductor wafer or an LCD which are electronic components as examples only for explaining the invention. Hence, such examples are not intended to limit the scope of the invention.

BACKGROUND ART

Generally, a substrate of a semiconductor, an LCD or the like is manufactured in a highly clean environment such as a so-called clean room. A manufacturing device for a semiconductor wafer or the like disposed in the clean room may include a plurality of processing devices for performing a variety of processes. In the processing devices, in order to enhance the production yield of a product (a conforming product ratio), a process chamber for performing a process is closed airtightly to realize a vacuum atmosphere in the process chamber, thereby maintaining the inside of the process chamber more highly clean to perform the process. Process chambers of the processing devices are connected to a transfer chamber for transferring a product among the processing devices. The transfer chamber can be also closed airtightly. A transfer robot is provided for the transfer chamber, so that a substrate can be transferred to the process chamber from a loadlock chamber for transferring the substrate into or out of the manufacturing device. Transfer devices have been improved to be capable of transferring a product in such a high-vacuum state (see Patent Document 1).

A transfer device 1A shown in FIG. 10 transfers a wafer or the like in a plurality of chambers in an ultra-vacuum atmosphere in a clean room.

The transfer device 1A is disposed on an opening portion formed in portion of a wall of a vacuum chamber 50S (a casing). The transfer device 1A includes a flange portion 11S (a base member), which is attached to the wall of the vacuum chamber 5OS in an airtight state in order to resist a high vacuum in the vacuum chamber 50S.

The flange portion 11S is provided with a fixed shaft 10S (a fixed shaft member) extending into the vacuum chamber 50S. Provided on an outer side of the fixed shaft 10S are hollow operation shafts 21S, 22S (rotary members). The operation shafts 21S, 22S are coaxial to the fixed shaft 10S and are disposed so as to be vertically displaced from each other in a rotatable manner via a bearing.

Provided on an inner side of the operation shafts 21S, 22S and an outer periphery of the fixed shaft 10S is an electromagnetic stator S (an armature). A rotor R using a permanent magnet is provided on an inner periphery of the operation shafts 21S, 22S. The stator S and the rotor R are positioned to face each other. The stator S and the rotor R form an electromagnetic motor M. The stator S is accommodated in a dented portion 13S formed in the fixed shaft 10S. On an outer periphery thereof (an open surface of the dented portion 13S), a partition wall member 14S is welded such that the inside of the dented portion 13S including the stator S is separated from the inside of the vacuum chamber 50S.

On the inner side of the operation shafts 21S, 22S, a resolver-type position detector 40S is provided for detecting positions of the operation shafts 21S, 22S. The position detector 40S is disposed in a region displaced from the motor M in an axial direction of the fixed shaft 10S. Similarly to the motor M, the position detector 40S includes a stator 42S and a rotor 41S. The stator 42S is accommodated in the dented portion 13S of the fixed shaft 10S similarly to the motor M. An outer periphery of the stator 42S is sealed by the partition wall member 14S.

A high-vacuum driving source is formed by the flange portion 11S, the fixed shaft 10S, the partition wall member 14S, the operation shafts 21S, 22S, the motor M and the position detector 40S.

Connected to the operation shafts 21S, 22S is a transfer arm assembly 30S (a drive arm). A pulley 31S is connected to the operation shaft 21S. An arm 32S is connected to the operation shaft 22S. The pulley 31S and the arm 32S can perform a handling of a product such as a semiconductor wafer via a movable mechanism (not shown) provided at an end of the transfer arm assembly 30S.

The transfer device 1A (the transfer robot) is formed by the transfer arm assembly 30S and the driving source.

[Patent Document 1] JP 2000-167792 A

DISCLOSURE OF THE INVENTION

Problems to be Solved by the Invention

In the above-described transfer device 1A, a pair of bearings B is disposed to sandwich the motor M for the operation shaft 21S, 22S. Accordingly, the length of the operation shaft 21S, 22S is the sum of the axial-direction length of the motor M and the stator 42 and the axial-direction length of the pair of bearings B. Hence, the axial-direction length of the operation shaft 21S, 22S is large, which is a problem in downsizing. Especially, when aligning the operation shafts 21S, 22S in the axial direction, the problem of the above-described length of the axial-direction may be critical.

In addition, in the above-described transfer device 1A, the resolver-type position detector 40S detects a position of the operation shaft 21S, 22S. Generally, the resolver-type position detector 40S may be easily affected by the stator S, so that the position detector 40S needs to be disposed apart from the stator S in the axial direction. Hence, the total size (the height) of the transfer device 1A in the axial-direction will be even larger.

In the above-described transfer device 1A, the stator S is accommodated in the dented portion 13S of the fixed shaft 10S and on the outer side thereof the partition wall member 14S is attached by welding. Hence, when the thickness of the partition wall member becomes large, a distance between the stator S and the rotor R becomes wide, thereby reducing a motor torque and the accuracy in stopping positions.

Further, the fixed shaft 10S and the operation shaft 21S, 22S are attached to each other via the pair of bearings B. Accordingly, in consideration of deflection, vibration or the like of the operation shaft 21S, 22S which maybe caused by rotation of the operation shaft 21S, 22S, the partition wall member 14S and the rotor R need to be provided with a sufficient distance therebetween, which may result in reduction in a motor torque and the accuracy in positioning.

In the transfer device 1A, a transfer arm assembly 30 is operated via a belt by rotation of the pulley attached to the operation shaft 21S in the arm 32S. The arm 32S of the transfer device 1A is in a vacuum atmosphere and no measures against dust such as a magnetic seal is taken to shield the inside of the arm 32S from the vacuum atmosphere. When the transfer device is used in an ultrahigh-vacuum ($10^{-6}$ Pa) atmosphere of high temperature, organic matter contained in a belt 77 vaporizes to fly in the vacuum chamber 50S, which may cause a pollution, thereby reducing production yield (a conforming product ratio).

Means for Solving the Problems

A driving source according to an aspect of the invention includes: a base member disposed on a casing; a fixed shaft extending from the base member into the casing; a rotating member coaxial to the fixed shaft; a bearing supporting the rotating member so as to be rotatable around the fixed shaft; a stator member coaxial to the fixed shaft; a rotor disposed on the rotating member so as to face the stator member; and a partition wall member which is disposed between the stator member and the rotor so as to be coaxial to the fixed shaft, the partition wall member separating an air atmosphere outside the casing from a vacuum atmosphere in the casing. In the driving source, the stator member is disposed on one of an outer circumference of the fixed shaft and an inner circumference of the outer circumference member. The bearing is disposed on the other of the outer circumference of the fixed shaft and the inner circumference of the outer circumference member. The stator member and the bearing are coaxially disposed in a common region in an axial direction of the fixed shaft.

In the driving source of the aspect of the invention, the stator member and the rotor which form a motor and the bearing are coaxially disposed in a common region in the axial direction of the rotation axis of the rotating member, thereby reducing an axial-direction length of the driving source. Hence, even when a plural number of the motor or the rotating member are disposed in the axial-direction, the axial-direction length of the driving source will not be large.

In a driving source according to an aspect of the invention, the base member may be disposed on an opening portion of the casing, and the outer circumference member and the fixed shaft may be disposed on a common side of the base member, the common side facing the inside of the casing.

In such an arrangement, the opening portion of the casing can be sealed, so that the base member can be attached to the casing in a simplest manner.

A driving source according to an aspect of the invention, the base member may be disposed on an outer side of the casing so as to be apart from the opening portion of the casing, and the base member and the casing may be connected by the outer circumference member.

In such an arrangement, a base portion can be supported via the outer circumference member and the driving source can be disposed so as to project toward the outside of the casing. Accordingly, the driving source does not occupy all space in the casing.

A driving source according to an aspect of the invention, the base member may be disposed on an inner side of the casing so as to be apart from the opening portion of the casing, and the base member and the casing may be connected by the fixed shaft.

In such an arrangement, the base portion can be supported via the fixed shaft. When a movable member or the motor is provided in a double manner, the arrangement is suitable for the one more apart from the opening portion of the casing.

A driving source according to an aspect of the invention, plural sets of the rotating member, the rotor, the stator member and the bearing may be disposed at positions displaced from each other in the axial direction of a common fixed shaft.

In such an arrangement, the size can be compact even when, for example, two drives are required for a frog-leg type transfer robot.

In a driving source with the aforesaid plural sets, one bearing of the sets may rotatably connect one rotating member of the sets and the fixed shaft, and another bearing of the sets may rotatably connect the one rotating member and another rotating member of the sets.

In such an arrangement, the bearings of each set can be disposed double in a common region of the axial direction, thereby downsizing the driving source.

A driving source of an aspect of the invention is a driving source disposed on a casing of which inside can be a vacuum atmosphere. The driving source includes: a base member attached in the casing, a partition wall member which is disposed on the base member and separates an air atmosphere and a vacuum atmosphere, an armature disposed in a ring shape on an inner side of the partition wall member on an air atmosphere side, the armature being close to the partition wall member, and a rotating member rotatably disposed on the base member at a position different from the partition wall member with a predetermined distance from the partition wall member.

In a driving source according to an aspect of the invention, the armature may include a plurality of armatures provided so as to be displaced from each other in a height direction, and the rotating member may be provided for each of the plurality of armatures.

The casing according to the aspect of the invention may be a process chamber (a vacuum chamber) of a processing device that performs a process for a substrate or a transfer chamber for transferring the substrate or the like to the process chamber by a transfer robot. The inside of the casing can be airtight or can be a state filled with lower-pressure gas than a normal air pressure by using a vacuum pump (hereinafter stated as a vacuum atmosphere).

In a driving source according to an aspect of the invention, a distance between the armature and the partition wall member may be constant.

The predetermined distance may be from 0.2 to 1.0 mm, more preferably from 0.2 to 0.5 mm and most preferably from 0.2 to 0.3 mm, for example. Although it is further preferable that the predetermined distance is equal to or less than 0.2 mm, the value equal to or more than 0.2 is obtained herein in consideration of displacement of the rotation center caused by rotation of the rotating member or a slight expansion (or a contraction) of the partition wall member in the vacuum atmosphere in the aspect of the invention. For example, when the partition wall member is made of stainless steel and has a thickness of 0.05 mm, the partition wall member can reliably resist an ultrahigh-vacuum during a process in the processing device. However, the above-described values of the thickness are presented in consideration of individual variability of the driving source produced in large quantities.

In a driving source according to an aspect of the invention, a magnet may be provided for the rotating member such that a position detector disposed on the inner side of the partition wall member can detect a position of the rotating member.

In a driving source according to an aspect of the invention, a material of the partition wall member may be nickel alloy.

In a driving source according to an aspect of the invention, the rotating member may be disposed on the base member at a position different from the partition wall member via a bearing member.

Such an arrangement eliminates the necessity of rigidity for rotatably supporting the rotating member, so that the thickness can be determined only in consideration of requirements for resistance in vacuum. In comparison with an arrangement in which the rotating member is provided to the partition wall member, the arrangement herein can reduce deflection caused by rotation of the rotating member or displacement of the rotation center of the rotating member caused by vibration of the rotating member. For the above-described reasons, the distance between the partition wall member and the rotating member can be narrower compared with the related art.

The partition wall member according to an aspect of the invention may have a cylindrical shape and may be formed with a flat plate, a corrugated plate or another type of plate of which ceiling portion has a larger thickness than a lateral portion (the cylindrical portion) such that the ceiling portion of the partition wall member can resist a pressure difference between the vacuum atmosphere and the air. The partition wall member may not be of metal such as stainless steel, but may be formed using a material of high permeability such as a crystal glass, a nickel alloy or the like.

The driving source according to an aspect of the invention may be employed for robots of scalar type such as a link-type robot having a frog-leg shape.

A transfer robot according to an aspect of the invention is a transfer robot for a substrate. The transfer robot includes: the aforesaid driving source, a driving arm fixed to a rotating member of the driving source so as to extend therefrom, a driven arm rotatably connected to an end of the driving arm, on the end the driving arm being not fixed to the rotating member, and an end effector rotatably connected to an end of the driven arm, on the end the driven arm being not connected to the driving arm. Operation of an armature rotates the driving arm and the driven arm interlocks with the rotation of the driving arm to advance and retract the end effector.

In a transfer robot according to an aspect of the invention, two driving arms may be provided on a lateral surface or an upper surface of the rotating member. Two driven arms may be connected near ends of the two driving arms such that two end effectors can advance and retract in a common direction or in different direction displaced in a rotation direction.

A transfer robot according to an aspect of the invention may include: the aforesaid driving source; a first driving arm fixed on a rotating member of the driving source so as to extend therefrom; a second driving arm having a rotation center thereof at a position different from that of the first driving arm, the position being displaced in the axial direction; a first driven arm and a second driven arm which are connected to the first driving arm and the second driving arm; a rotation transmitter which transmits rotation of the first driving arm and/or a second source to the first driven arm and/or the second driven arm; an end effector rotatably supported by the first driven arm and the second driven arm.

In the above-described driving source according to the aspect of the invention, the armature is provided on the air side of the partition wall, thereby isolating the source of dust. In addition, the rotating member is provided on the vacuum atmosphere side of the partition wall and a bearing member rotatably supporting the rotating member is provided inside the casing but not on the partition wall. Accordingly, unlike an arrangement in which the rotating member is rotatably provided on the partition wall, it is not necessary to consider deflection, vibration or the like caused by rotation of the rotating member and it is possible to reduce the distance between the partition wall and the movable member, so that the partition wall may not have enough rigidity for supporting the rotating member. Hence, the partition wall can be thinner compared with the related art, which allows the armature to be disposed closer to the rotating member, thereby increasing excitation and enhancing the accuracy in positioning.

In such a driving source, since the partition wall is provided to the base member independently from the fixed shaft member or the rotation shaft member, it is only necessary that the partition wall has a thickness enough to resist an ultrahigh-vacuum atmosphere, thereby simplifying the structure and facilitating maintenance of a vacuum atmosphere.

In the driving source according to an aspect of the invention, a magnetism-shielding unit is provided between the armature and the sensor, so that a distance between the armature and the sensor can be narrower without causing affection on the operation of the sensor. Accordingly, the total height of the driving source can be shortened, realizing a downsizing.

The transfer robot with the above-described driving source does not require a belt or the like which may be a dust source. The arrangement in which the partition wall member isolates the armature, the sensor or the like of the driving source can reduce the dust.

EXPLANATION OF CODES

Figure 1:
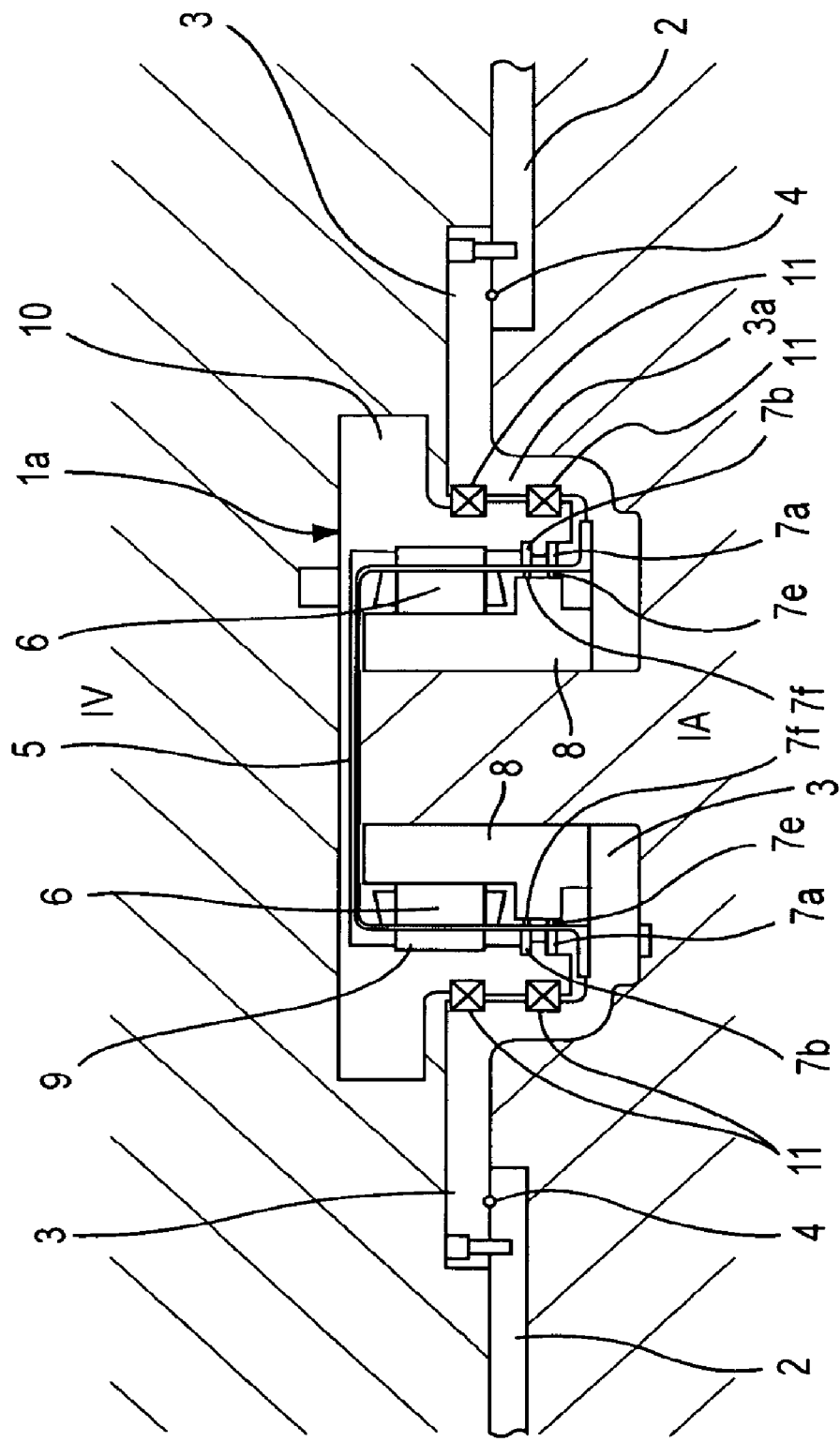
FIG. 1 is a vertical cross section showing a driving source having one rotating member according to a first embodiment of the invention.

1: driving source
2: casing
3: base member
4: O-ring
5: partition wall member
6, 6a, 6b: armature (stator member)
7a to 7h: sensor
8: fixed shaft member
9, 9a, 9b: magnet (rotator)
10, 10a, 10b: rotating member
11, 11a, 1b: bearing
12: transfer robot
13, 13a, 13b: driving arm 14, 14a, 14b: driven arm
15: end effector
16: substrate
17a, 17b: spindle
18: steel belt
19: rotation transmitter
20: casing

BEST MODE FOR CARRYING OUT THE INVENTION

First Embodiment

FIG. 1 shows a driving source 1a of a first embodiment of the invention.

The driving source 1a is disposed on an opening portion of a casing 2 of which inside can be a vacuum atmosphere, the driving source 1a driving a transfer robot that performs a transfer of a product or the like in the casing 2.

The driving source 1a includes a base member 3. The base member 3 is attached to the casing 2 by being fixed so as to cover the opening portion of the casing 2. An O-ring 4 is disposed in a contacting portion of the base member 3 and a periphery of the opening portion of the casing 2 so as to maintain an airtight state therebetween. A fixed shaft member 8 is disposed on a middle portion of the base member 3 so as to extend into the casing 2. The fixed shaft member 8 is hollow and an inside space of the fixed shaft member 8 is in communication with the base member 3. Note that on the same side of the base member 3, a partition wall member 5 having a cylindrical shape with a bottom surface is disposed so as to cover the fixed shaft member 8. The partition wall member 5 separates a vacuum region IV inside of the casing 2 and an air region IA outside the casing 2 so as to be airtight from each other.

The base member 3 projects in a box-like shape downward in the figure. An upright portion (an outer circumference member) is coaxial to the partition wall member 5. On an inner side of the outer circumference member, bearings 11 aligned in two lines are disposed, by which a cylindrical rotating member 10 is rotatably supported. The rotating member 10 is supported such that an inner circumference of the rotating member 10 is disposed with a predetermined distance relative to an outer circumference of the partition wall member 5.

On the inner circumference of the rotating member 10, a magnet 9 (a rotator) and sensors 7a, 7b are coaxially disposed. On an outer circumference of the fixed shaft member 8, an armature 6 (a stator member) and sensors 7e, 7f are coaxially disposed. The magnet 9 and the armature 6 are disposed so as to face each other with the partition wall member 5 interposed. The sensors 7a, 7b are disposed so as to respectively face the sensors 7e, 7f with the partition wall member 5 interposed. Each couple of the components facing each other is disposed such that ends of the components are sufficiently near the partition wall member 5 to face each other with a minimum distance therebetween.

In the above-described first embodiment, not only the armature 6 as the stator member and the magnet 9 as the rotator but also the pair of bearings 11 are disposed coaxially in a common region in the axial direction of the fixed shaft member 8. Accordingly, the axial-direction length of the driving source 1a can be shortened.

Second Embodiment

Figure 2:
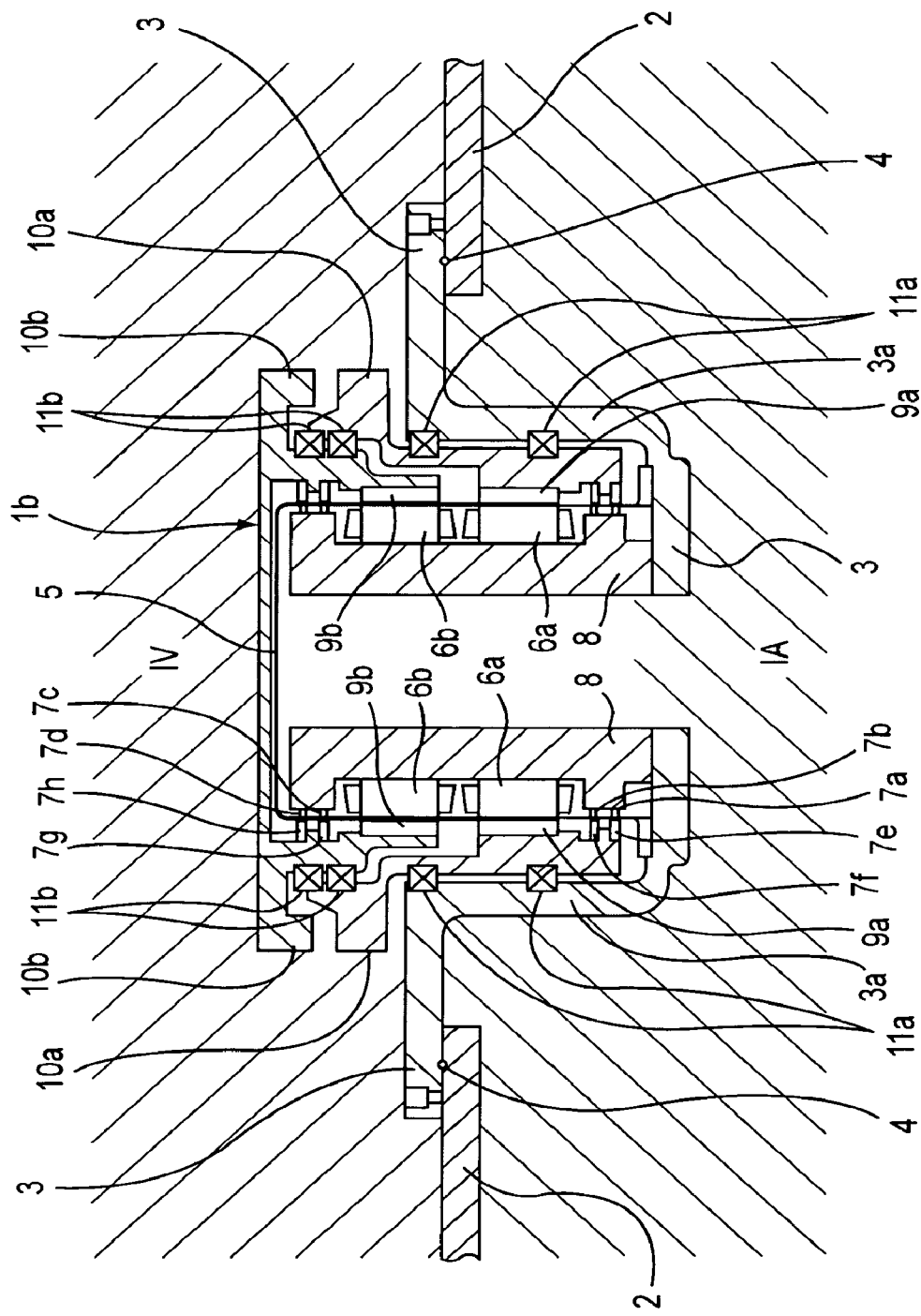
FIG. 2 is a vertical cross section showing a driving source having two rotating members according to a second embodiment of the invention.
Figure 3:
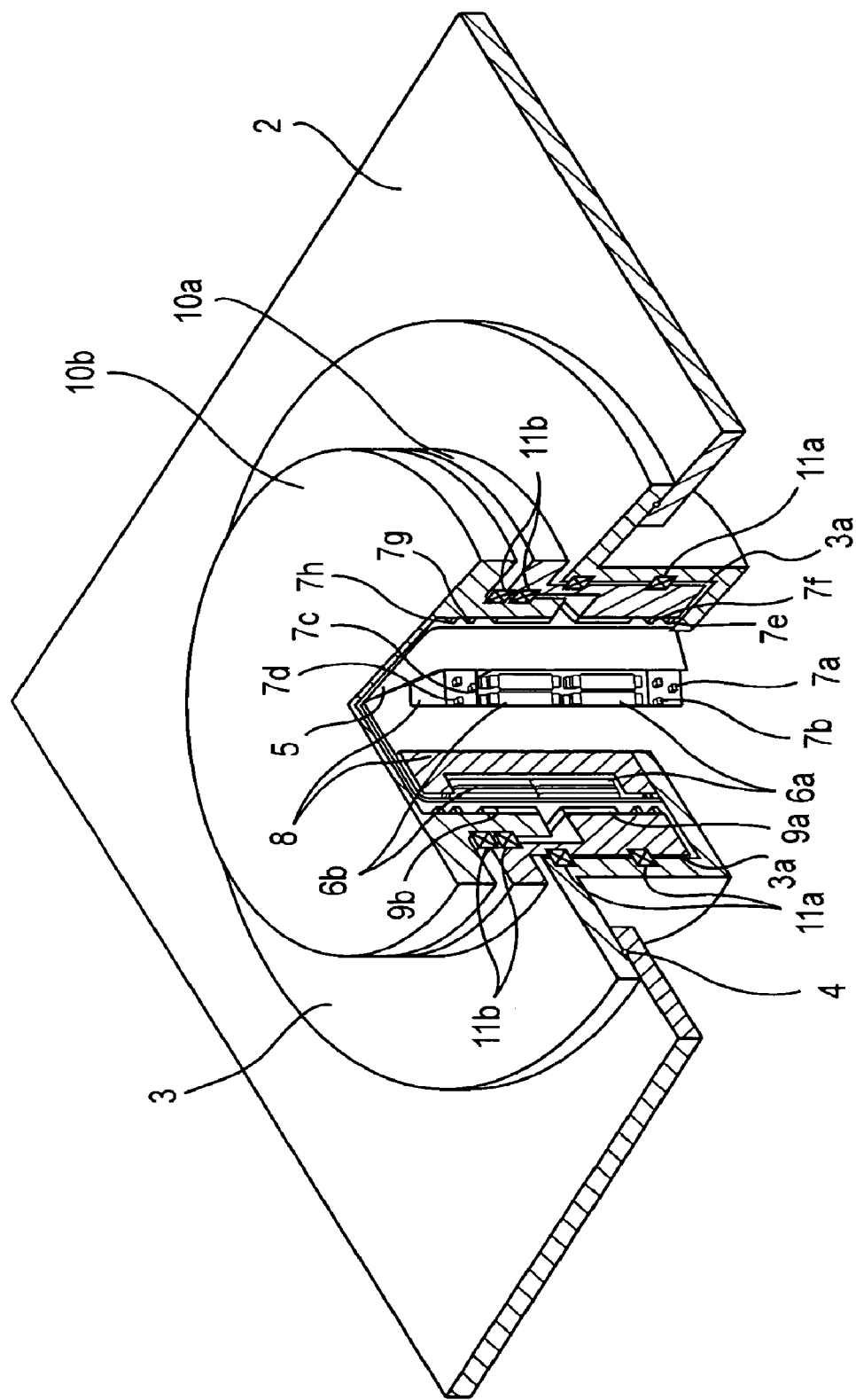
FIG. 3 is a partially-sectional perspective view of the driving source on FIG. 2.

FIGS. 2 and 3 show a driving source 1b of which fixed shaft member 8 has two rotating members 10a, 10b displaced in a height direction.

The driving source 1b is disposed on the casing 2 of which inside can be a vacuum atmosphere. The base member 3 and its outer circumference member, the partition wall member 5, the fixed shaft member 8 or the like are arranged in a similar manner to the first embodiment, so that the same explanation will be omitted.

In the second embodiment, the fixed shaft member 8 is provided with the two rotating members 10a, 10b. As is described in the first embodiment, the rotating member 10a out of the two members 10a, 10b is rotatably supported by the outer circumference member of the base member 3 via bearings 11a aligned in two lines. The other rotating member 10b is rotatably connected on an upper inner side of the rotating member 10a via bearings 11b aligned in two lines and is supported by the base member 3 via the rotating member 10a. In such an arrangement, the base member 3 and the rotating member 10a are rotatable relative to each other and the rotating members 10a, 10b are also rotatable relative to each other. Accordingly, both of the rotating members 10a, 10b are rotatable relative to the base member 3.

Disposed on the inner circumference of the rotating member 10a are the sensors 7e, 7f and magnets 9a, 9b (rotators). Facing thereto with the partition wall member 5 interposed are the sensors 7a, 7b and the armatures 6a, 6b as the stator members which are disposed on the outer circumference of the fixed shaft member 8. Ends of these components facing each other are disposed near the partition wall member 5 so as to face each other with a predetermined small distance therebetween.

On the inner circumference of the rotating member 10b, sensors 7g, 7h and magnets 9c, 9d (rotators) are disposed. Facing thereto with the partition wall member 5 interposed are sensors 7c, 7d and armatures 6c, 6d (stator members) which are disposed on the outer circumference of the fixed shaft member 8. Ends of these components facing each other are disposed near the partition wall member 5 so as to face each other with a predetermined small distance therebetween.

In the second embodiment, not only the armatures 6a, 6b as the stator members and the magnets 9a, 9b as the rotators but also the bearings 11a, 11b are disposed coaxially in a common region in the axial direction of the fixed shaft member 8. Accordingly, the axial-direction length of the driving source 1b can be shortened.

Note that the partition wall member 5 of the second embodiment has a thickness of approximately 0.3 mm. This thickness is required for the partition wall member 5 not to be deformed or damaged and to perform a process for a semiconductor wafer or the like in a high-vacuum state of, for example, from about $10^{-1}$ Pa to $10^{-5}$ Pa or in an ultrahigh-vacuum state of, for example, $10^{-6}$ Pa.

The second embodiment employs a transfer robot 12a that is provided with a transfer arm connected to the rotating members 10a, 10b and transfers a product inside the casing 2.

Figure 4:
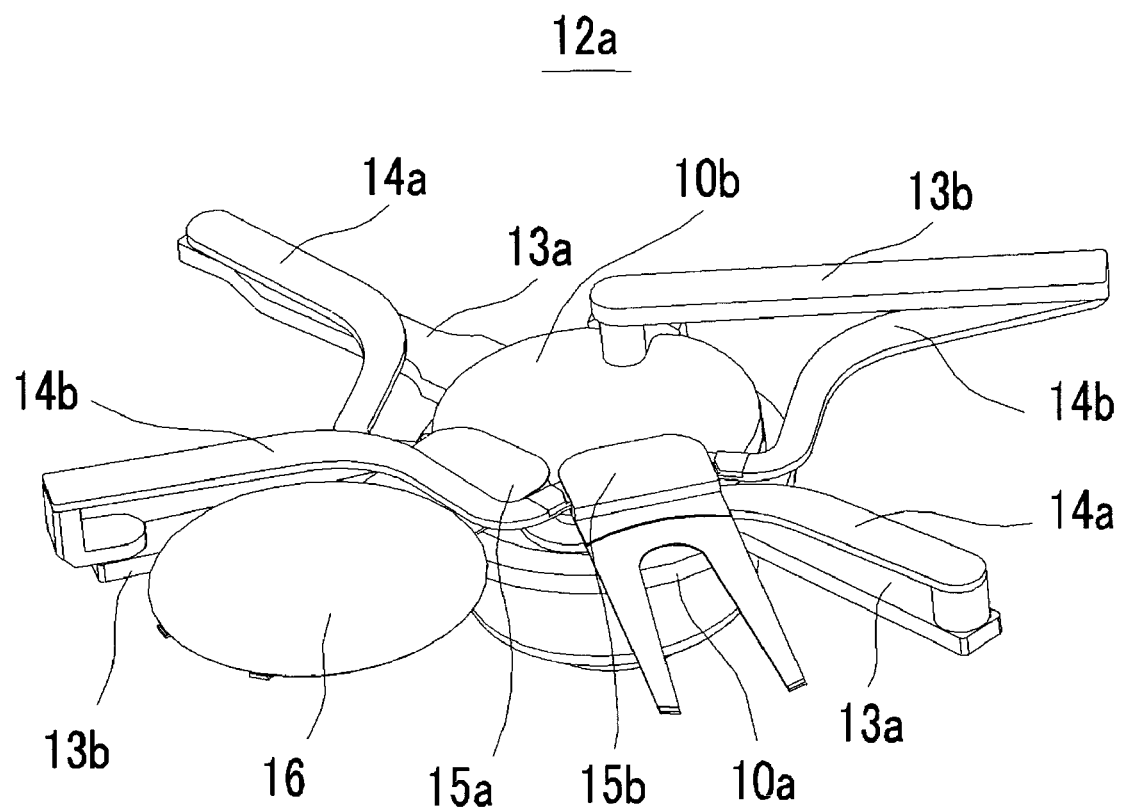
FIG. 4 is a perspective view of a transfer arm of the second embodiment.

In FIG. 4, an advancing and retracting direction of an end effector holding a substrate 16 or the like of the transfer robot 12a is adapted to be different from a rotating direction of the end effector. The transfer robot 12a is provided with driving arms 13a, 13b extending horizontally from lateral surfaces and upper surfaces of the rotating members 10a, 10b of the driving source 1b. In the transfer robot 12a, the driving source 1 operates the driving arms 13a, 13b to rotate such that driven arms 14a, 14b supported at ends of upper surfaces of the driving arms 13a, 13b interlock, thereby advancing and retracting the end effector 15 rotatably supported by the driven arms 14a, 14b in a horizontal plane.

In the transfer robot 12a shown in FIG. 4, one driven arm 14 is provided to the driving arm 13 at an end on the upper surface of the driving arm 13.

Figure 5:
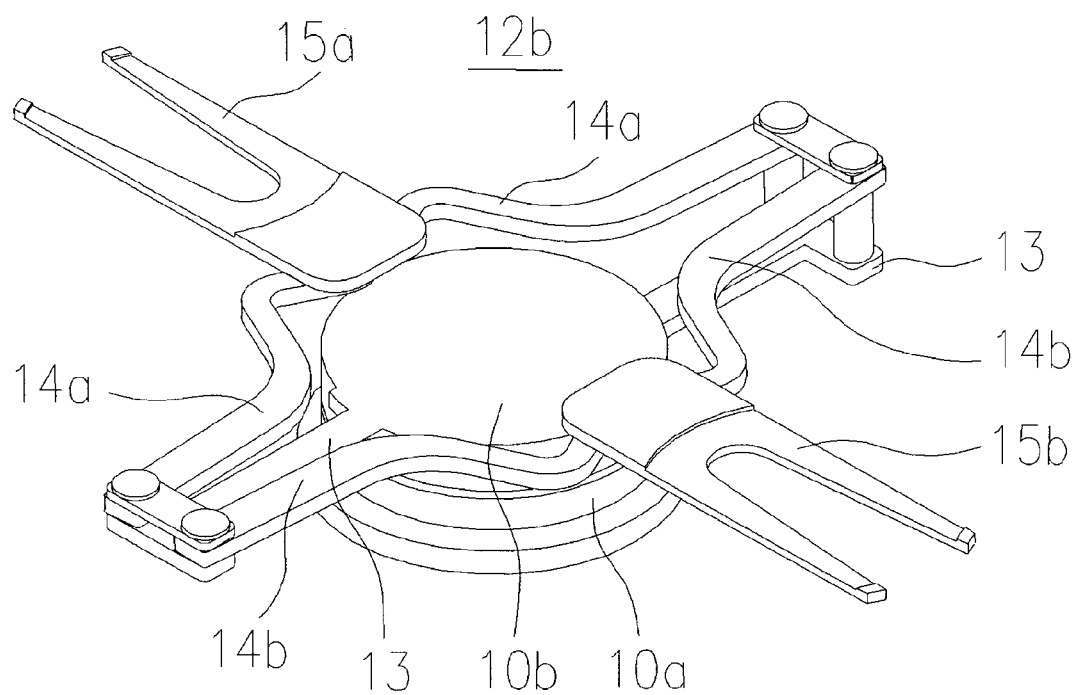
FIG. 5 is a perspective view of a modification of the transfer arm of the second embodiment.

In contrast, in a transfer robot 12b shown in FIG. 5, the two driven arms 14a, 14b are provided to one driving arm 13 at an end on the upper surface of the driving arm 13. End effectors 15a, 15b are provided near ends of the driven arms 14a, 14b. Accordingly, advancing and retracting movements in 180-degree opposite directions can be realized, so that one end effector can be operated by the driving source to move in an advancing direction and the other end effector can interlock to retract, thereby performing a handing and receiving of a substrate.

Figure 6:
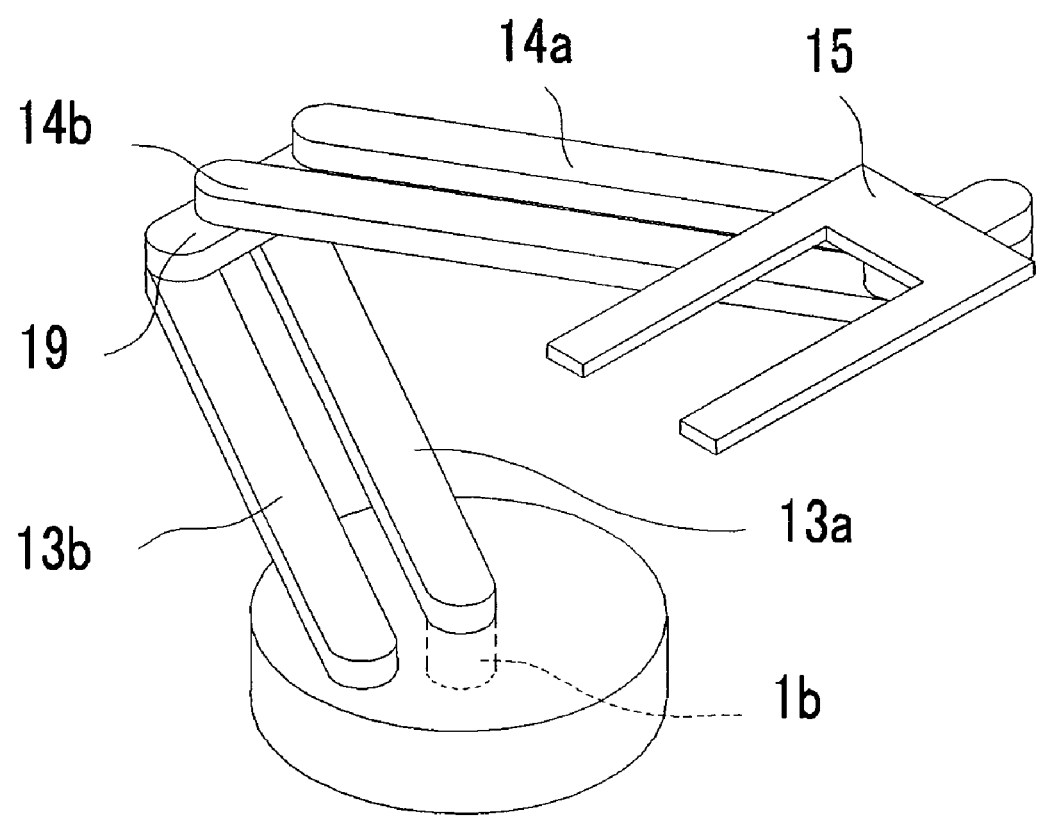
FIG. 6 is a perspective view of another modification of the transfer arm of the second embodiment.

A transfer robot 12c shown in FIG. 6 includes the driving source 1a shown in FIG. 1, the driving arm 13a fixed on the rotating member 10 of the driving source 1a so as to extend from the rotating member 10, the driving arm 13b having the rotation center at a position different from that of the driving arm 13a, a rotation transmitter 19 that rotatably supports the driving arms 13a, 13b and the driven arms 14a, 14b and transmits rotation of the driving arms 13a, 13b to the driven arms 14a, 14b, and the end effector 15 rotatably supported by the driven arms 14a, 14b.

Figure 7:
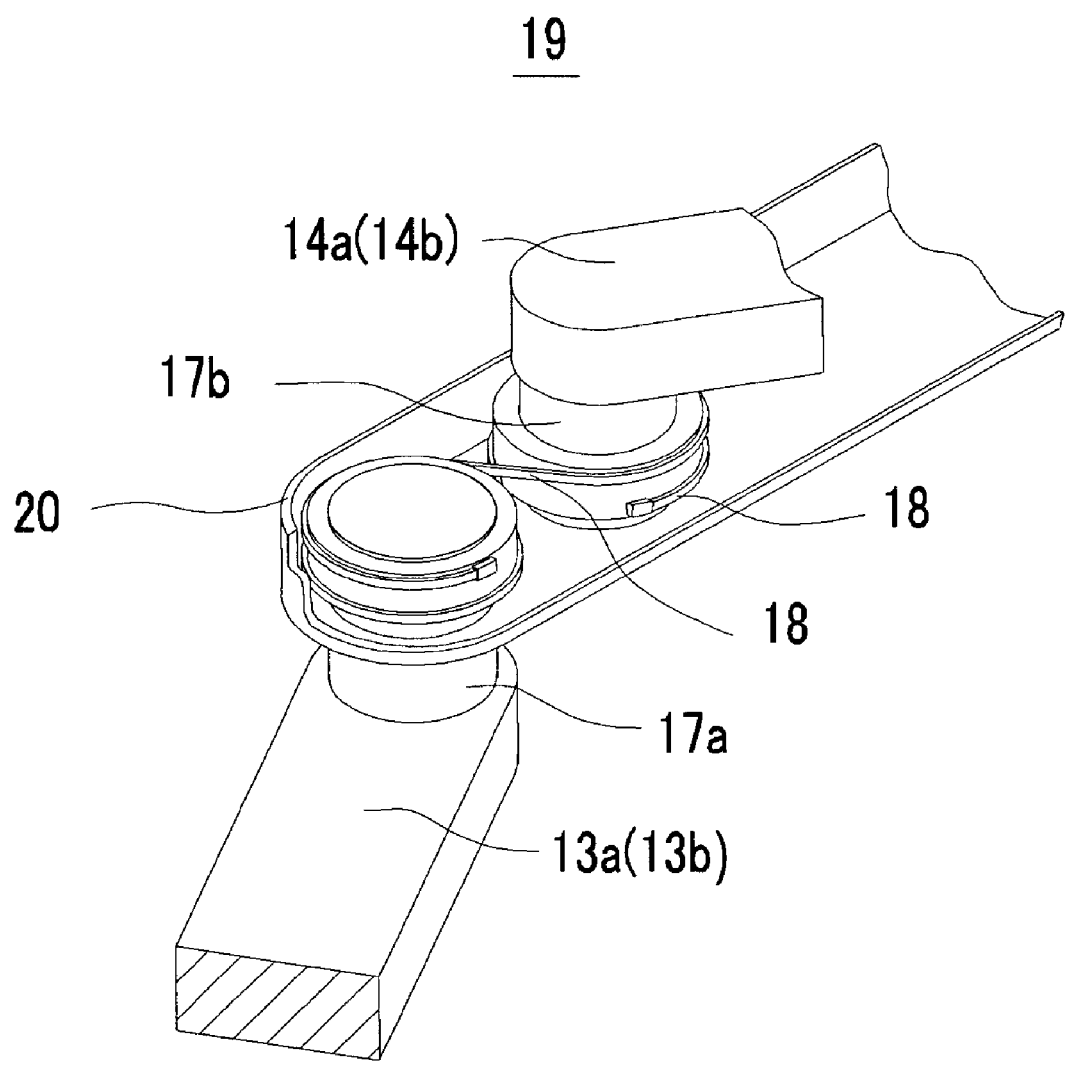
FIG. 7 is a partially cut-out perspective view of a joint portion of the transfer arm of FIG. 6.

FIG. 7 is a partially cut-out perspective view of the rotation transmitter 19 of the transfer robot 12c shown in FIG. 6. The rotation transmitter 19 includes a casing 20 and rotatably supports the spindle 17a provided to the driving arm 13a, 13b and the spindle 17b provided to the driven arm 14a, 14b. Around the lateral sides of the spindles 17a, 17b, the two steel belts 18 are wound in S and reversed S shapes. Accordingly, the rotation of the driving arm 13a, 13b can be transmitted to the driven arms 14a, 14b.

Two steel belts 18 are provided on lateral surfaces of spindles 17a, 17b that rotatably support the end effector 15 on the driven arms 14a, 141, the steel belts 18 being displaced in a height direction from each other and wound in S and reversed S shapes. Accordingly, the spindles 17a and 17b are rotatable relative to the end effector 15 in opposite directions by a common angle. Such a rotation transmitter is a mechanism similar to a below-described rotation transmitter shown in FIG. 7.

Third Embodiment

Figure 8:
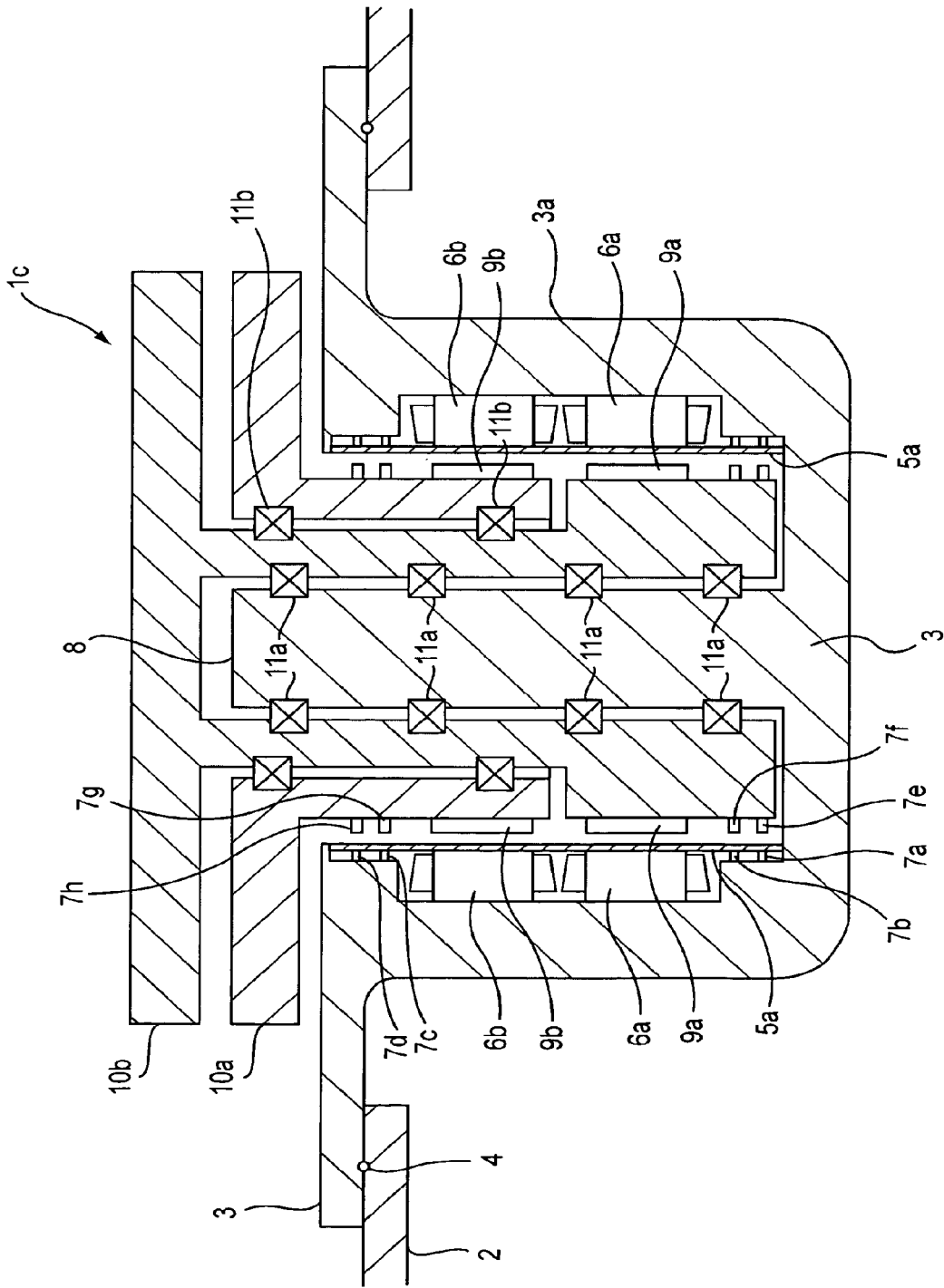
FIG. 8 is a vertical cross section showing a driving source having two rotating members according to a third embodiment of the invention.

FIG. 8 shows a driving source 1c of which fixed shaft member 8 has the two rotating members 10a, 10b displaced in the height direction.

The driving source 1c is disposed to the casing 2 of which inside can be a vacuum atmosphere. The base member 3 and an outer circumference member 3a thereof, the partition wall member 5, the fixed shaft member 8 or the like are arranged in a similar manner to the second embodiment, so that the same explanation will be omitted. Note that, in the third embodiment, the outer circumference member 3a is formed comparatively long in the axial direction and almost all of the armatures 6a, 6b and the magnets 9a, 9b of the two pairs of rotating members 10a, 10b are disposed outside the casing 2.

In the third embodiment, the rotating member 10b is rotatably supported on the outer circumference of the fixed shaft member 8 via the bearings 11a aligned in four lines and the rotating member 10a is rotatably supported on the outer side of the rotating member 10a via the bearings 11b aligned in two lines. Accordingly, similarly to the second embodiment, the rotating members 10a, 10b are rotatable relative to the base member 3.

In the third embodiment, the armatures 6a, 6b as the stator members are disposed on an outer side of the magnets 9a, 9b as the rotators, which is the opposite of the second embodiment.

Dented portions are formed in an inner circumference of the outer circumference member 3a of the base member 3. The armatures 6a, 6b are accommodated in the dented portions. Openings of the dented portions are closed by the partition wall member 5a.

The magnets 9a, 9b to face the armatures 6a, 6b are disposed on the outer circumference of the rotating members 10a, 10b so as to be close to each other with a predetermined distance therebetween, which is similar to the second embodiment.

Note that the sensors 7a to 7h are disposed in the opposite manner of the second embodiment.

In the third embodiment, not only the armatures 6a, 6b as the stator members and the magnets 9a, 9b as the rotators but also the bearings 11a, 11b are disposed coaxially in a common region in the axial direction of the fixed shaft member 8. Accordingly, the axial-direction length of the driving source 1c can be shortened.

Fourth Embodiment

Figure 9:
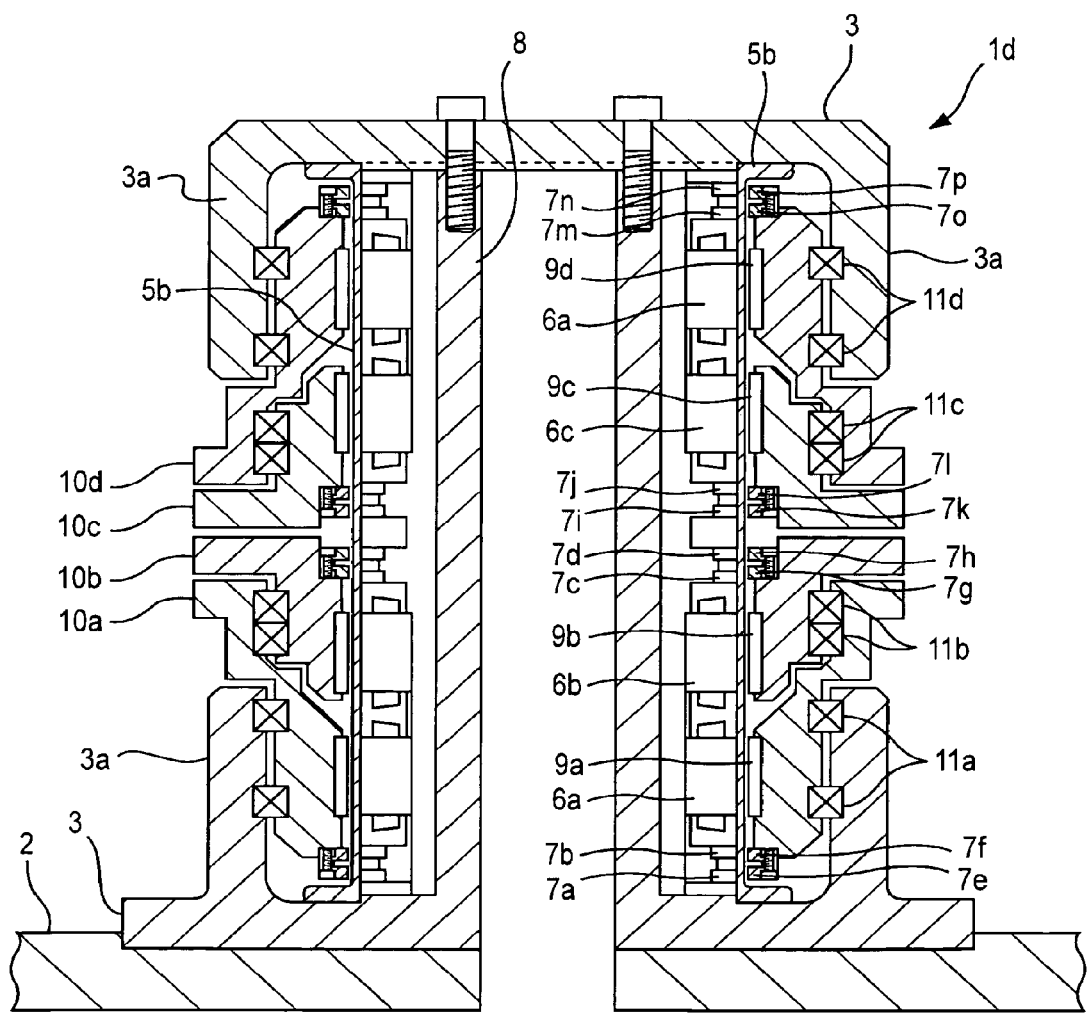
FIG. 9 is a vertical cross section showing a driving source having two rotating members according to a fourth embodiment of the invention.
Figure 10:
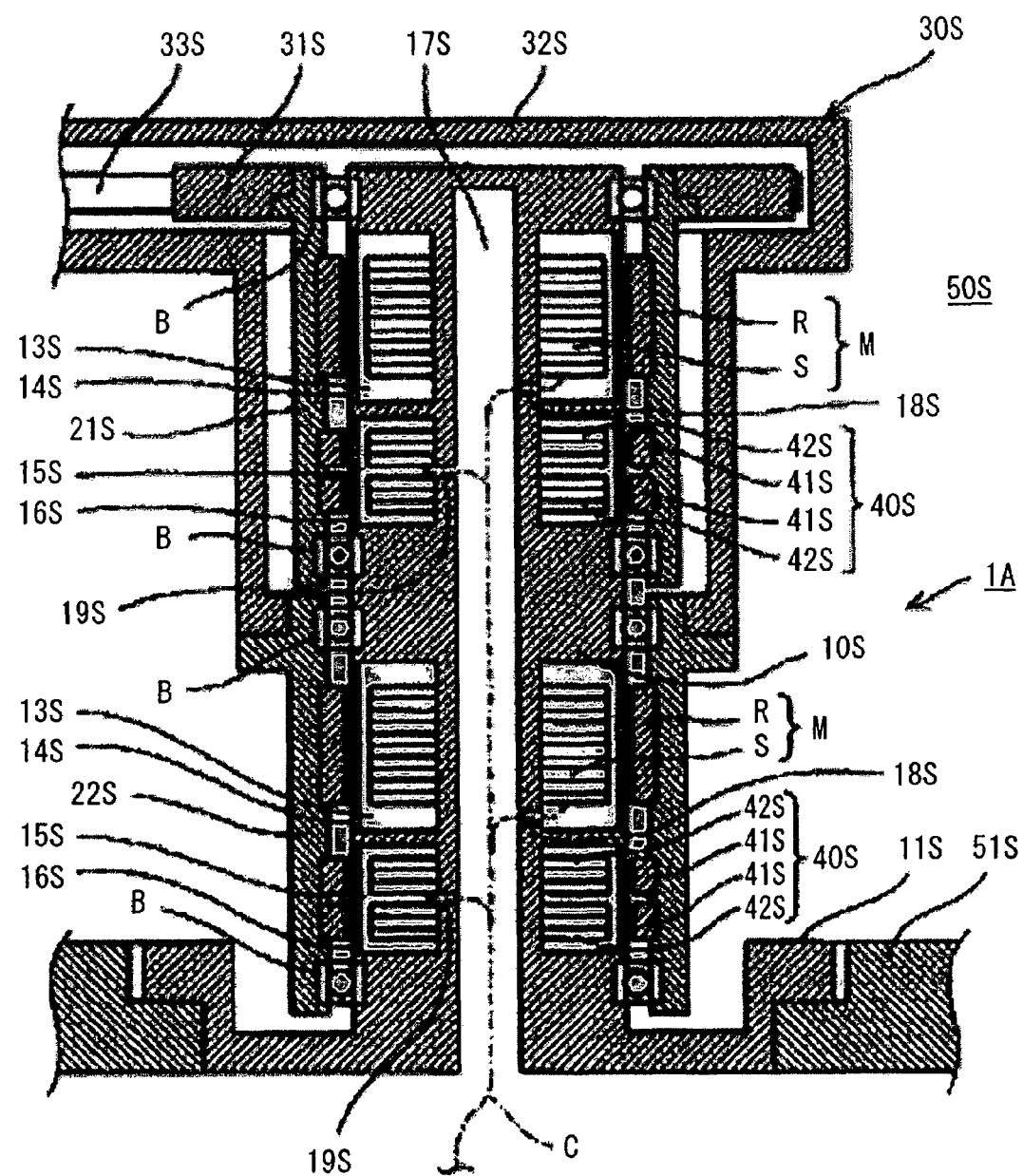
FIG. 10 is a perspective view of a related art driving source.

FIG. 9 shows a driving source 1d of which fixed shaft member 8 has four rotating members 10a to 10d displaced in the height direction.

The driving source 1d is disposed on the casing 2 of which inside can be a vacuum atmosphere. The base member 3, the partition wall member 5, the fixed shaft member 8 or the like are arranged in a similar manner to the second embodiment, so that the same explanation will be omitted.

In the fourth embodiment, the cylindrical outer circumference member 3a rises in the axial direction from the base member 3 into the casing 2. Fixed to the end of the fixed shaft member 8 is an end member 130. The end member 130 has a disc-like shape corresponding to the base member 3. On an outer circumference of the end member 130, an outer circumference member 130a is provided so as to rise toward the base member 3.

The rotating member 10a is rotatably supported on the inner circumference of the outer circumference member 3a via the bearings 11a aligned in two lines and the rotating member 10b is rotatably supported on the inner side of the rotating member 10a via the bearings 11b aligned in two lines. Accordingly, the rotating members 10a, 10b are rotatable relative to the base member 3.

The rotating member 10c is rotatably supported on an inner circumference of the outer circumference member 130a via bearings 11c aligned in two lines and the rotating member 10d is rotatably supported on an inner side of the rotating member 10c via bearings 11d aligned in two lines. Accordingly, the rotating members 10c, 10d are rotatable relative to the end member 130 and the base member 3.

On the inner circumference of the rotating members 10a to 10d, the magnets 9s to 9d as the rotators are disposed. The armatures 6a to 6d as the stator members are disposed on the outer circumference of the fixed shaft member 8 so as to face the rotating members 10a to 10d. A cylindrical partition wall member 5b is disposed between the armatures 6a to 6d and the magnets 9a to 9d such that the armatures 6a to 6d respectively face the magnets 9a to 9d with a predetermined distance with the partition wall member 5b interposed in the distance.

Note that the sensors 7a to 7h and sensors 7i to 7p are disposed near the armatures 6a to 6d and the magnets 9a to 9d.

Also in the fourth embodiment, not only the armatures 6a to 6d as the stator members and the magnets 9a to 9d as the rotators but also the bearings 11a to 11d are disposed coaxially in a common region in the axial direction of the fixed shaft member 8. Accordingly, the axial-direction length of the driving source 1d can be shortened.

Note that the scope of the present invention is not limited to the aforesaid embodiments and detail portions of the structures may be arranged in embodying an aspect of the invention.

In addition, each functional component of the embodiments may be replaced with another like component. For example, the bearing may not be a so-called roller bearing but may be a self-lubricating bearing of synthetic resin material or the like. Further, a layout of each component or a connecting-structure may be arbitrarily designed and a material of each component may be appropriately selected in accordance with requirements.

The invention claimed is:

1. A driving source, comprising:
a base member disposed on a casing;
a fixed shaft extending from the base member into the casing;
a rotating member coaxial to the fixed shaft;
a bearing supporting the rotating member so as to be rotatable around the fixed shaft;
a stator member coaxial to the fixed shaft;
a rotator disposed on the rotating member so as to face the stator member;
a partition wall member which is disposed between the stator member and the rotator so as to be coaxial to the fixed shaft, the partition wall member separating an air atmosphere outside the casing from a vacuum atmosphere in the casing; and
an outer circumference member which is a part of the base member disposed on an outer side of the fixed shaft so as to be coaxial to the fixed shaft, wherein
the stator member is disposed on an outer circumference of the fixed shaft, and
the bearing is disposed on the inner circumference of the outer circumference member.

2. The driving source according to claim 1, wherein
the base member is disposed on an opening portion of the casing, and
the outer circumference member and the fixed shaft are disposed on a common side of the base member, the common side facing the vacuum atmosphere side of the casing.

3. The driving source according to claim 1, wherein
the outer circumference member of the base member is disposed on a position between the air atmosphere and vacuum atmosphere so as to be apart from the opening portion of the casing, and
the base member includes a flange, the flange connecting the base member and the casing.

4. The driving source according to claim 1, wherein
plural sets of the rotating member, the rotator, the stator member and the bearing are disposed at positions displaced from each other in the axial direction of the fixed shaft.

5. The driving source according to claim 4, wherein
one bearing rotatably connects one rotating member and the outer circumference member, and another bearing rotatably connects the one rotating member and another rotating member.

6. A driving source disposed on a casing of which inside is a vacuum atmosphere, comprising:
a base member attached to the casing,
a partition wall member which is disposed on the base member and separates an air atmosphere and a vacuum atmosphere,
an armature disposed in a ring shape on an air atmosphere side of the partition wall member,
the armature being close to the partition wall member,
a rotating member rotatably disposed at a position different from the partition wall member with a predetermined distance from the partition wall member, and
an outer circumference member which is a part of the base member coaxially disposed on an outer side of the partition wall member and connected to the rotating member by a bearing in the vacuum atmosphere.

7. The driving source according to claim 6, wherein
the armature includes a plurality of armatures provided so as to be displaced from each other in a height direction, and
the rotating member comprises a rotating member for each of the plurality of armatures.

8. The driving source according to claim 6, wherein
a distance between the armature and the partition wall member is constant.

9. The driving source according to claim 1, wherein
a magnet is fixed to the rotating member such that a position detector disposed on the air atmosphere side of the partition wall member can detect a position of the rotating member.

10. The driving source according to claim 1, wherein
a material of the partition wall member is nickel alloy.

11. A transfer robot, comprising:
a driving source including:
a base member disposed on a casing;
a fixed shaft extending from the base member into the casing;
a rotating member coaxial to the fixed shaft;
a bearing supporting the rotating member so as to be rotatable around the fixed shaft;
a stator member coaxial to the fixed shaft;
a rotator disposed on the rotating member so as to face the stator member;
a partition wall member which is disposed between the stator member and the rotator so as to be coaxial to the fixed shaft, the partition wall member separating an air atmosphere outside the casing from a vacuum atmosphere in the casing; and
an outer circumference member which is a part of the base member disposed on an outer side of the fixed shaft so as to be coaxial to the fixed shaft, wherein
the stator member is disposed on an outer circumference of the fixed shaft,
the bearing is disposed on an inner circumference of the outer circumference member, and,
the stator member and the bearing are coaxially disposed in a common region in an axial direction of the fixed shaft,
a driving arm fixed at one end to the rotating member of the driving source so as to extend therefrom,
a driven arm rotatably connected at one end to the other end of the driving arm; and an end effector rotatably connected to the other end of the driven arm, wherein the driving source rotates the driving arm and the driven arm interlocks with the rotation of the driving arm to advance and retract the end effector.

12. A transfer robot, comprising:

a driving source disposed on a casing of which inside is a vacuum atmosphere, including:

a base member attached to the casing, a partition wall member which is disposed on the base member and separates an air atmosphere and the vacuum atmosphere, an armature disposed in a ring shape on the air atmosphere side of the partition wall member, the armature being close to the partition wall member, a rotating member rotatably disposed at a position different from the partition wall member with a predetermined distance from the partition wall member, an outer circumference member which is a part of the base member coaxially disposed on an outer side of the partition wall member and connected to the rotating member with a bearing in the vacuum atmosphere, and a driving arm fixed at one end to the rotating member of the driving source so as to extend therefrom, a driven arm rotatably connected at one end to the other end of the driving arm, an end effector rotatably connected to the other end of the driven arm, wherein the driving source rotates the driving arm and the driven arm interlocks with the rotation of the driving arm to advance and retract the end effector.

13. The transfer robot according to claim 11, wherein the rotating member comprises a first rotating member and a second rotating member;

the driving arm comprises a first driving arm and a second driving arm, the first driving arm having a first end and a second end, the first end of the first driving arm being provided on a lateral surface or an upper surface of the first rotating member, the second driving arm having a first end and a second end, the first end of the second driving arm being provided on a lateral surface or an upper surface of the second rotating member;

each driven arm comprises a first driven arm and a second driven arm, the first driven arm having a first end and a second end, the first end of the first driven arm being connected to the second end of the first driving arm, the second driven arm having a first end and a second end, the first end of the second driven arm being connected to the second end of the second driving arm;

the end effector comprises a first end effector and a second end effector, the first end effector is connected to the second end of one of the first driven arms and one of the second driven arms, the second end effector is connected to the second end of the other first driven arm and the other second driven arm; and the first and second end effectors advance and retract in a common direction or in different direction displaced in a rotation direction.

14. The transfer robot according to claim 12, wherein the rotating member comprises a first rotating member and a second rotating member;

the driving arm comprises a first driving arm and a second driving arm, the first driving arm having a first end and a second end, the first end of the first driving arm being provided on a lateral surface or an upper surface of the first rotating member, the second driving arm having a first end and a second end, the first end of the second driving arm being provided on a lateral surface or an upper surface of the second rotating member;

each driven arm comprises a first driven arm and a second driven arm, the first driven arm having a first end and a second end, the first end of the first driven arm being connected to the first driving arm near the second end of the first driving arm, the second driven arm having a first end and a second end, the first end of the second driven arm being connected to the second driving arm near the second end of the second driving arm;

the end effector comprises a first end effector and a second end effector, the first end effector is connected to one of the first and one of the second driven arms near the second ends of the one first and second driven arms, the second end effector is connected to the other first and second driven arms near the second ends of the other first and second driven arms; and the first and second end effectors advance and retract in a common direction or in different direction displaced in a rotation direction.

15. A transfer robot, comprising:

a driving source disposed on a casing of which inside is a vacuum atmosphere, including:

a base member attached to the casing, a partition wall member which is disposed on the base member and separates an air atmosphere and the vacuum atmosphere, an armature disposed in a ring shape on the air atmosphere side of the partition wall member, the armature being close to the partition wall member, and a rotating member rotatably disposed on a circumference member of the base member at a position different from the partition wall member with a predetermined distance from the partition wall member, an outer circumference member which is a part of the base member coaxially disposed on an outer side of the partition wall member and connected to the rotating member with a bearing in the vacuum atmosphere, and a first driving arm fixed on the rotating member of the driving source so as to extend therefrom;

a second driving arm having a rotation center thereof at a position different from that of the first driving arm;

a rotation transmitter which is rotatably supported by the first driving arm and the second driving arm, and the rotation transmitter transmitting rotation of the first driving arm and/or the second driving arm to a first driven arm and/or a second driven arm; and an end effector rotatably supported by the first driven arm and the second driven arm.

16. The driving source according to claim 1, wherein the stator member and the bearing are coaxially disposed in a common region in an axial direction of the fixed shaft.

* * * * *